(12) United States Patent
Scott

(10) Patent No.: US 8,946,638 B2
(45) Date of Patent: Feb. 3, 2015

(54) SUBPIXEL RESOLUTION BY INTERPOLATION OF CROSSTALK FROM ADJACENT PIXELS

(76) Inventor: Basil Henry Scott, Kapaa, HI (US)

( * ) Notice: Subject to any disclaimer, the term of this patent is extended or adjusted under 35 U.S.C. 154(b) by 313 days.

(21) Appl. No.: 13/605,560

(22) Filed: Sep. 6, 2012

(65) Prior Publication Data

US 2014/0063306 A1    Mar. 6, 2014

Related U.S. Application Data

(60) Provisional application No. 61/531,542, filed on Sep. 6, 2011.

(51) Int. Cl.
*G01J 5/20* (2006.01)
*H04N 5/365* (2011.01)
*H01L 27/146* (2006.01)
*H04N 5/359* (2011.01)
*H04N 5/232* (2006.01)

(52) U.S. Cl.
CPC .......... *H04N 5/365* (2013.01); *H01L 27/14609* (2013.01); *H04N 5/359* (2013.01); *H04N 5/23235* (2013.01)
USPC ....................................................... 250/338.4

(58) Field of Classification Search
CPC .............................................. G09G 2320/0209
USPC ............................................ 250/338.1–338.5
See application file for complete search history.

(56) References Cited

U.S. PATENT DOCUMENTS

2011/0031418 A1*    2/2011   Shcherback et al. ...... 250/559.29

* cited by examiner

*Primary Examiner* — Kiho Kim
(74) *Attorney, Agent, or Firm* — Martin E. Hsia; Keri Ann K. S. Krzykowski

(57) ABSTRACT

A pixel interconnect circuit that can be added to a focal plane array to enable subpixel location capability (subpixel sensing) for an imaged point source, facilitating very high frame rate operation. The pixel interconnect is typically added as a circuit component within the readout integrated circuit. The interconnect function can be turned on or off flexibly. It allows very low pixel count arrays, such as 128×128 pixels, to achieve the positional accuracy of multi-megapixel arrays. In turn, these small arrays can be clocked at very fast frame rates for enhanced threat and fast event detection. Existing systems can be upgraded by adding the pixel interconnect, which will greatly improve tracking and position accuracy without increasing data processing requirements. By modifying the focal plane while leaving other components unchanged, the pixel interconnect provides an economical upgrade for threat warning and tactical sensor systems.

10 Claims, 8 Drawing Sheets

SUBPIXEL RESOLUTION BY INTERPOLATION OF CROSSTALK FROM ADJACENT PIXELS

This application claims the priority of U.S. provisional patent application no. 61/531,542 filed Sep. 6, 2011.

TECHNICAL FIELD

The present invention generally relates to camera focal plane arrays. More specifically, the invention relates to a process and device for optimizing camera focal plane arrays used in threat detection systems, tactical warning systems, and other special security systems. The camera focal plane array of the present invention can be fabricated from multiple materials and can operate in the ultraviolet (UV), visible, or infrared (IR) spectral bands.

BACKGROUND ART

Current military threat detection optical sensors are optimized to work against "traditional" threats such as heat-seeking surface-to-air missiles targeting aircraft. In many cases, these systems do not provide desired and required capabilities to address new threats. These new threats include unsophisticated weapons, such as those used by irregular militia in Afghanistan, as well as advanced weaponry developed by modern adversaries.

Both the unsophisticated and the advanced weapons pose similar challenges to detector technology. The first issue is sensor speed. For unsophisticated weapons, fast sensing is required to detect brief events such as gunfire muzzle flash. For advanced weaponry, some new missiles employ high-speed maneuvering designed to defeat older systems that operate at slower rates. To successfully address the full range of threats, modern sensors need to operate at rates greater than 1000 frames per second. A rate of 4000 frames per second will allow a sensor system to address the full range of potential threats and to provide capabilities such as threat identification that are highly desired.

A second issue is precision threat location. Systems require highly precise identification of threat locations so that countermeasures can be employed. Examples of precision threat location are locating a sniper and tracking a missile. Providing advanced automated countermeasures and counterattacks requires higher precision than is currently available in many sensors. Examples would be automatic return of weapons fire, or laser designation of enemy hostile fire.

Unfortunately, increasing the precision of threat location is a competing requirement with high-speed operation. Higher optical precision is typically accomplished through higher resolution imagery, which means more pixels in each frame. Increasing both the total frame rate and the total number of pixels in each frame (pixel count) can result in an unacceptably large increase in total input/output (I/O) signals or data. For example, some very capable sensors today operate at 1000 frames per second with a 256×256 sensor. To achieve 4000 frames per second with a 1K×1K sensor (1 megapixel) would require 64× higher I/O. This large data rate would require the replacement of most system components, rather than an upgrade of the sensor only. Furthermore, some technology components to handle this large data rate might not be available, or would be prohibitive in cost, size, weight, or power.

Accordingly, it is an object of the present invention to increase resolution without increasing pixel count to achieve high-precision, high-speed detection (sensing) capabilities that can be used against newer threats.

It is another object of the present invention to provide said sensing capabilities in a manner that is relatively inexpensive, compact, lightweight, and powerful.

It is still another object of the present invention to provide said sensing capabilities in a manner that can be incorporated as an upgrade to existing systems.

The invention described herein increases resolution without increasing pixel count. In fact, pixel counts can be reduced by a factor of four or more so that total I/O does not increase as the frame rate is increased. This allows high-precision, high-speed sensing in a configuration that fits within the system "footprint" of legacy sensors. Using this approach, it is possible to upgrade existing systems by replacing sensor modules only: total system replacement is not required. The invention therefore enables higher retrofitting of existing systems to attain precision and increased detection capability against newer threats.

The following patents may be relevant to the field of the invention:

U.S. Pat. No. 7,333,181 to Scott et al., incorporated herein by reference, discloses a sensor chip assembly that contains a focal plane array constructed as a semiconductor chip with two interconnected layers. The first layer comprises multiple position sensing detectors made from infrared sensitive semiconductor material and arranged in an array of position sensing detectors. The second layer is made of trans impedance amplifiers and associated on-chip signal processing elements made from an electronic semiconductor material.

U.S. Pat. No. 6,815,790 to Bui et al., incorporated herein by reference, discloses a position sensing detector for improved resolution and accuracy in two-dimensional positions sensing in the 1.3 to 1.55 micron wavelength region.

U.S. Pat. No. 6,462,326 to Cleaver, incorporated herein by reference, discloses an electronic circuit that adapts the output of a position sensing detector, designed to determine the position of an incident CW laser beam, to determine the position of a fast pulsing laser incident on the detector's surface.

U.S. Pat. No. 5,723,869 to Costa et al., incorporated herein by reference, discloses a position sensing detector with a plurality of electronically isolated sensing channels containing ends and an output current lead at each end of each channel.

U.S. Pat. No. 6,528,788 to Galloway, incorporated herein by reference, discloses a method for determining the position of an object within an area viewed by a single detector of an array, in which signals from detectors adjacent to the single detector are compared with each other and/or the single detector. The method can be extended to larger objects to ascertain the location of edges.

U.S. Pat. No. 6,373,050 to Pain et al., incorporated herein by reference, discloses a circuit for reading a signal from an infrared detector, which includes a current-mode background-signal subtracting circuit having a current memory which can be enabled to sample and store a dark level signal from the infrared detector during a calibration phase.

U.S. Pat. No. 6,147,340 to Levy, incorporated herein by reference, discloses a background suppression technique using well-controlled and repeatable charge skimming operations to increase the charge capacities of the integration capacitors of integrated focal plane readout unit cells.

U.S. Pat. No. 5,128,543 to Reed et al., incorporated herein by reference, discloses a time-of-flight analyzer, such as a secondary ion surface analyzer, and methods are disclosed wherein a beam of charged particles is created, magnified, directed along a path to a detector, detected and the time of flight measured.

It is also known in astronomy to de-focus an image of a star (a subpixel light source) on a pixel array to create a blur detected by multiple pixels, and to interpolate the position of the star as the center of the blur.

DISCLOSURE OF THE INVENTION

The above and other objects are preferably achieved by a process for subpixel resolution of a light spot on a focal plane array comprising: interconnecting a plurality of pixels with interconnections having signal changing properties; illuminating one of the pixels with the light spot to generate crosstalk current flows to neighboring pixels; measuring at least one of the crosstalk current flows to the neighboring pixels; determining signal metrics among the crosstalk current flows; and calculating subpixel resolution of the light spot by associating the signal metrics with a location on the focal plane array using a method selected from the group consisting of a look up table and an equation.

The interconnecting step described above preferably further comprises using an interconnection with a pixel-to-pixel connection having read out circuit elements. The signal changing properties of the interconnections are also preferably selected from the group consisting of capacitance, resistance, impedance, or a combination thereof.

The presently preferred embodiment of the invention also is a process for subpixel resolution of a light spot on a pixel in an array of pixels, with a first pixel having a first sheet resistance operably connected to a first readout device, which first pixel is interconnected with an interconnection (having an interconnect resistance and signal changing properties) to a second pixel having a second sheet resistance operably connected to a second readout device, wherein the first sheet resistance and the second sheet resistance have been optimized to provide a total resistance seen by a readout amplifier connected to the first and second readout devices to avoid noise amplification issues created by low impedance comprising: determining the average background brightness of the array of pixels; illuminating the first pixel with the light spot to generate a primary signal current flow to the first readout device and a crosstalk signal current flow to the second readout device through the interconnection to the second pixel; subtracting the average background brightness from the primary signal current flow and the crosstalk signal current flow; determining signal metrics for the primary signal current flow measured at the first readout device and the crosstalk signal current flow measured at the second readout device; and calculating the subpixel resolution of the light spot by relating the signal metrics to a position on the array of pixels using a method selected from the group consisting of a look up table and position calculation equations.

The presently preferred embodiment of the invention is also a process for subpixel resolution of a light spot on a plurality of interconnected pixels, each of the pixels having a signal contact defining virtual quadrants and interconnections spanning between neighboring pixels, wherein each of the interconnections has signal changing properties comprising: illuminating one of the virtual quadrants with the light spot to generate crosstalk current flows to neighboring pixels through the interconnections; measuring the crosstalk current flows at the interconnections; and determining the subpixel resolution of the light spot within the virtual quadrants from the crosstalk current flows.

The signal changing properties of the interconnections in the process described above are selected from the group consisting of capacitance, resistance, impedance, or a combination thereof.

The presently preferred embodiment of the invention is also a pixel array having a plurality of interconnected pixels comprising: a first pixel, having a first semiconductor layer with a second semiconductor layer laid on top of the first semiconductor layer, wherein the first pixel has a first sheet resistance and a first signal contact operably connected to a first read out device; a second pixel, having a third semiconductor layer with a fourth semiconductor layer laid on top of the third semiconductor layer, wherein the second pixel has a second sheet resistance and a second signal contact operably connected to a second read out device; wherein the first pixel and the second pixel are connected by an interconnection having signal changing properties. Illumination of the first pixel generates a primary signal current that travels to the first signal contact and is read by the first readout device and a crosstalk signal current that travels through the interconnection and the second signal contact to the second readout device. The signal metrics of the primary signal current read by the first readout device and the crosstalk signal current read by the second readout device allows for subpixel sensing.

In the pixel array described above, the second semiconductor layer and the fourth semiconductor layer are preferably effectively thinned to optimize the first sheet resistance and the second sheet resistance. The interconnection is also preferably a pixel-to-pixel connection having read out circuit elements, and the signal changing properties are preferably selected from the group consisting of capacitance, resistance, impedance, or a combination thereof.

BEST MODE FOR CARRYING OUT THE INVENTION

Figure 1:
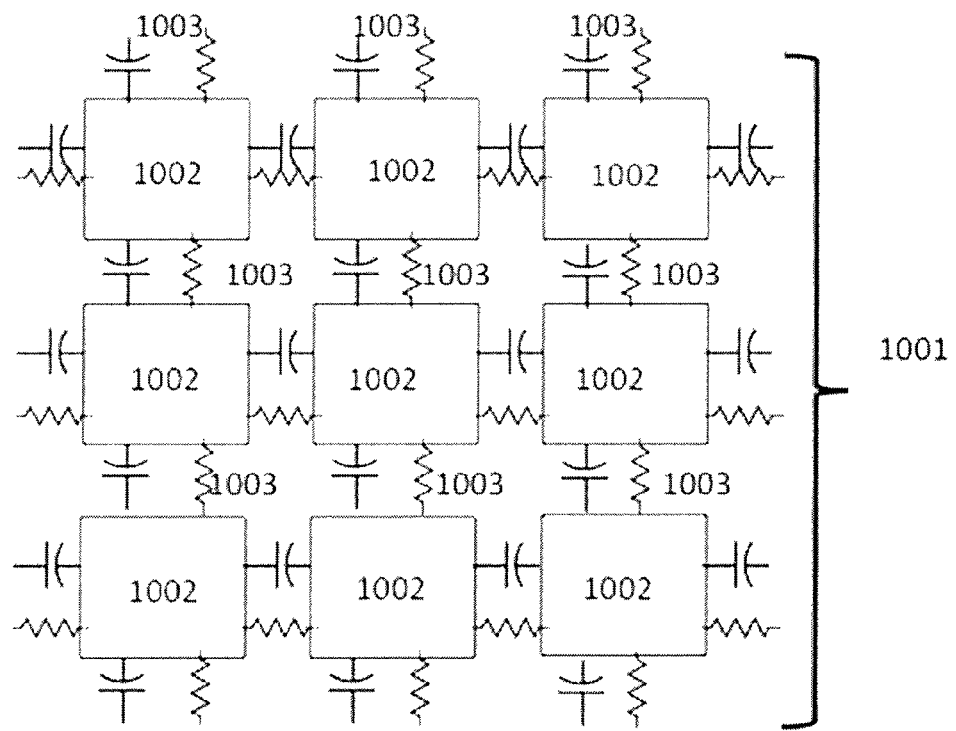
FIG. 1—depicts a top schematic view of the present invention's interconnected pixel array with subpixel sensing, FIG. 2—depicts a side schematic view of the present invention's interconnected pixel array with subpixel sensing.
Figure 1:
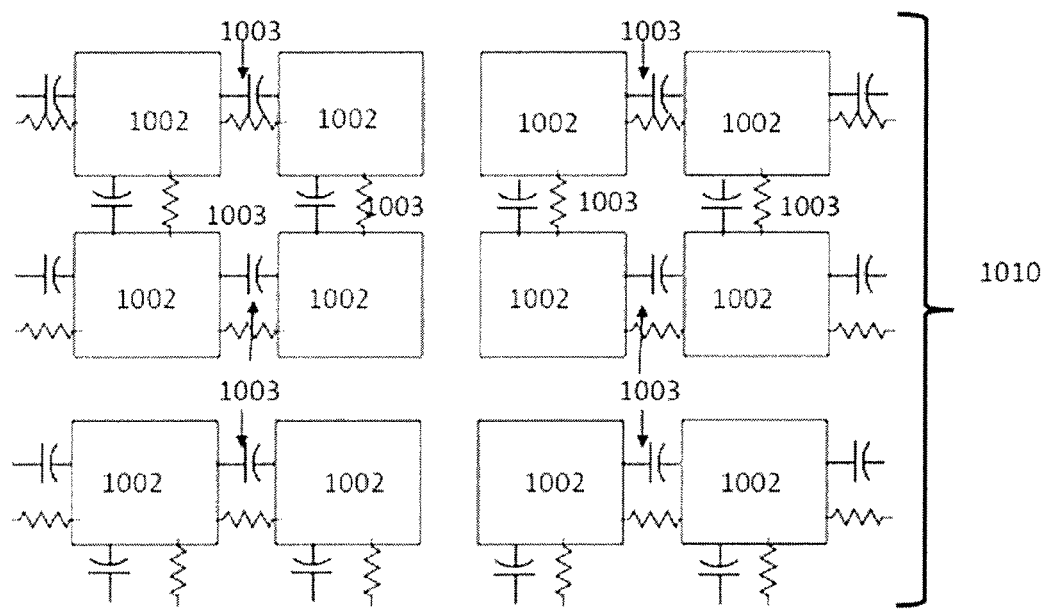

The present invention is an interconnected pixel array with subpixel resolution sensing, that is, resolution more precise than a single pixel. It is a detector geometry that provides a subpixel positional location capability (subpixel sensing) for an imaged point source. The present invention supports large or small pixel sizes and a high or low array element count. It can be implemented in any p-on-n or n-on-p diode detector, or any other pixel based detector that experiences crosstalk from adjacent pixels.

Crosstalk is any phenomenon by which a primary signal transmitted on one circuit or channel of a transmission system creates another signal (a crosstalk signal) in another circuit or channel. Crosstalk typically degrades performance and is usually highly undesirable. Crosstalk is usually caused by unwanted capacitive, inductive, conductive or other coupling from one circuit, part of a circuit, or channel, to another. The presently preferred embodiment of the invention interconnects pixels and uses a desired level of pixel-to-pixel crosstalk. This is atypical because, normally, designers avoid crosstalk between pixels.

In a presently preferred embodiment of the invention, the crosstalk impedance is designed to avoid excess noise or other problematic issues, when considering sheet resistance (see below). Electrical impedance is the measure of the opposition that a circuit presents to the passage of a current when a voltage is applied. It is a function of frequency (cycles per second). In quantitative terms, it is the complex ratio of the voltage to the current in an alternating current (AC) circuit. Impedance extends the concept of electrical resistance in direct current (DC) circuits to AC circuits, and possesses both magnitude and phase, unlike resistance which has only magnitude. When a circuit is driven with direct current (DC), there is no distinction between impedance and resistance; the latter can be thought of as impedance at zero frequency. Low impedance means that two elements in a circuit are well connected and tend to act as one. High impedance means that two elements are well isolated. In focal plane arrays, high-impedance between pixels usually is desired to avoid excess noise and other problems.

Additionally, preferably the crosstalk in the presently preferred embodiment of the invention can be turned on or off dynamically, allowing the system to operate in non-crosstalk, crosstalk-enabled, and mixed modes. When turned on, the crosstalk signal is processed to perform subpixel sensing. The crosstalk signal is isolated from primary signals through signal processing methods including background subtraction and signal recognition methods.

Crosstalk signal processing is performed in several steps. First, average background brightness is determined: this is the scene brightness with no signal of interest present. This can be done continuously by temporally averaging pixel signals, or episodically, by forming signal averages from nearby pixels after an event occurs, or both. Once an event is detected using well-known statistical methods, the average background brightness is subtracted from a group of pixels that includes the pixel or pixels that see the event (which generate a primary signal from the event), plus some or all of the surrounding pixels (which generate a crosstalk signal from the event). Signal metrics (ratios or arithmetic differences normalized for signal intensity) are then calculated from the group of pixels. These are used to determine position within the group of pixels on the focal plane, with the help of position look up tables or equations that relate the signal metrics to position within the group of pixels. By contrast, conventional arrays determine position by detecting only which pixel or pixels see the event directly (without processing crosstalk signals), so that their maximum resolution is limited to a single pixel.

By employing these crosstalk processing methods, it is possible to achieve very good subpixel resolution. For example, based on device-level finite element analysis, it is possible to achieve a positional resolution of $1/25^{th}$ the pixel size with a signal to noise ratio of 23 dB. With 13 dB signal to noise, it is still possible to achieve a positional resolution of $1/8^{th}$ the pixel size. Finite element analysis, or FEA, is a well-known engineering and science numerical analysis, or computer modeling, method for analyzing the behavior of devices. FEA models the device in question as a large number of connected cells. Each cell is very small compared to the size of the device being modeled. Cell interactions are defined and modeled by the basic physical equations of state that govern their behavior. These are typically differential equations. FEA models are run iteratively thousands or millions of times to determine device behavior to very high levels of accuracy.

The presently preferred embodiment of the present invention employs pixels that are larger than the diffraction-limited image blur size of the optical system (the theoretical maximum resolution of the optical system). This is also atypical because, normally, pixels are smaller than the blur size—½ the blur size or smaller. Because the pixels are larger than normal, fewer are required in an array that is matched to a specific image size. For example, 128×128 elements with a 60 micrometer (μm) pixel pitch would yield a 7.7 mm square focal plane, a typical size for a tactical system. Pixel pitch (or dot pitch) is a specification for a pixel-based device (such as a computer display or image scanner) that describes the distance between dots (pixels) of the same color on the inside of a display screen. A larger number mean higher resolution. Closer spacing generally produces a sharper image.

With an array that is matched to a typical image size, the present invention supports the full, and typically large, field-of-view that is required for tactical arrays. In addition, the reduced element count enables high-speed operation, for example 4000 frames per second, while avoiding extremely high data output rates that would impose difficult processing requirements or require excessive I/O connections or replacement of data processing equipment.

In the presently preferred embodiment of the invention, the positional accuracy of an array with a much larger pixel count can be achieved. For example, with $1/25^{th}$ subpixel resolution, a nominal 128×128 array provides the positional accuracy of a standard 1600×1600 array, assuming the standard array can achieve a positional resolution of ½ pixel. If this large 1600×1600 array were clocked at 4000 frames per second, the total output rate would be over 20 gigabytes per second. This high data rate is unsupportable by current I/O and processing technologies, and thus would be unusable, assuming it could be built.

The presently preferred best modes for carrying out the present invention are illustrated by way of example in FIGS. 1-9.

There are two methods of interconnecting the array of the present invention. FIG. 1 depicts two alternative top plan views. Array 1001 shows a fully interconnected array. In this arrangement, every pixel 1002 connects to four neighboring pixels in the array, except for pixels on the periphery, which connect to three (pixels along the sides) or two (pixels in the corners). The interconnections (interconnects) 1003 have signal changing properties that may be capacitive, resistive, impedance, or a combination thereof, or any other property that allows interpolation of signals based on different travel distances of those signals through interconnects to read out devices.

The alternate top plan view 1010 depicts the array of the present invention with grouped interconnects. Groups consist of any number of elements (two or greater). View 1010 shows a "quad" arrangement, in which all elements are interconnected in groups of four. The grouped array is realized by eliminating certain interconnections 1003.

Figure 2:
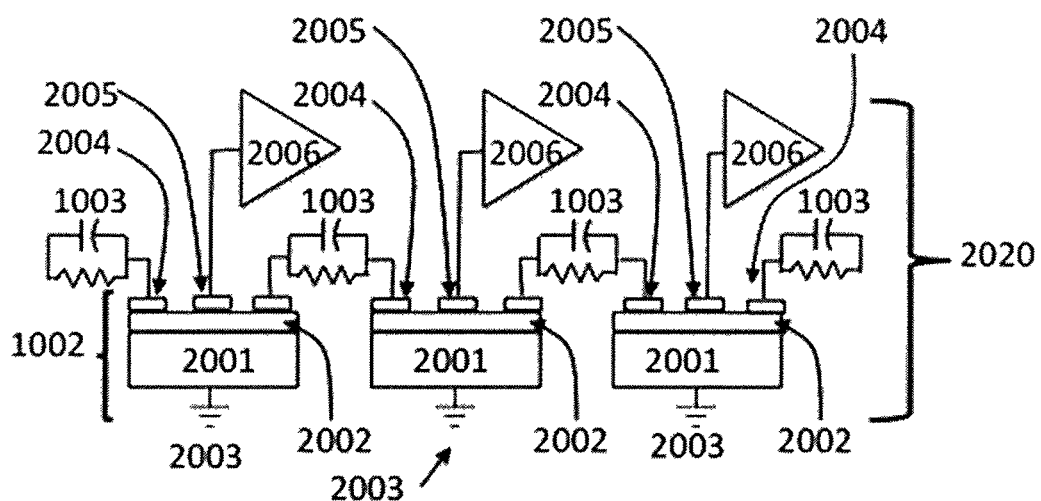

FIG. 2 shows a side view 2020 of pixel 1002 with interconnects 1003. The side view, depicts a schematic representation of how the detectors are made with a first layer 2001 that is either n-type or p-type semiconductor, and second layer 2002 that is either p-type or n-type semiconductor (opposite of the first layer). A p-n junction is formed at the boundary between a p-type and n-type semiconductor. Thus, together these form the p-n junction that creates the photodiode 1002. A photodiode is a type of photodetector capable of converting light into either current or voltage, depending upon the mode of operation.

The photodiode 1002 also includes a ground 2003 (each diode has a separate ground), and signal contacts 2005. The signal contact connects to readout amplifier 2006. In addition, there are two interconnect contacts 2004 for each diode. They connect to the interconnect structure 1003. The detector, consisting of layers 2001 and 2002, contacts 2004 and 2005, and ground connection 2003 is connected to the readout, which includes amplifier 2006 and interconnect 1003, using well-known methods such as indium bump interconnections.

In an alternate embodiment, the interconnect contacts 2004 may not be present; instead, the interconnect structure may be part of the detector structure itself rather than part of the readout circuit, which is the implementation depicted in FIGS. 1 and 2.

Figure 3:
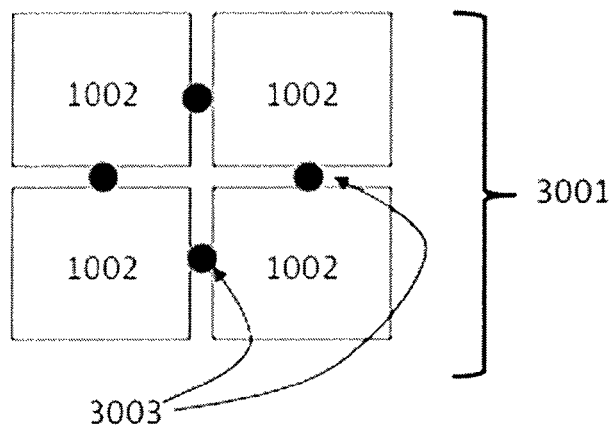
FIG. 3—depicts detector interconnect methods.
Figure 3:
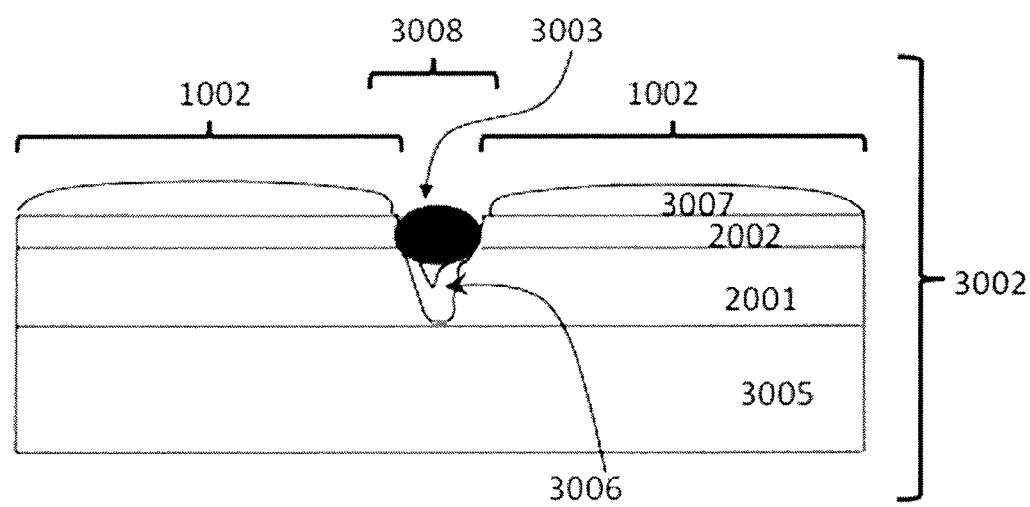
Figure 3:
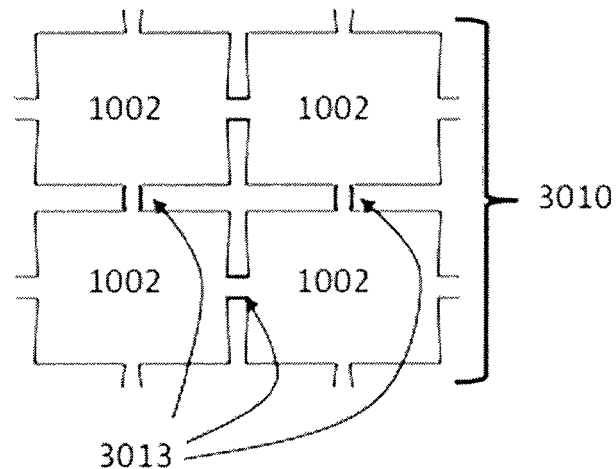

FIG. 3 depicts two examples in which the pixel interconnect is part of the detector structure. Pixels 1002 are formed by an etch step that creates a trench 3008 to delineate the pixels. The two pixels are interconnected with special material 3003 to form array 3001.

The side view 3002 depicts how this is done, as well as presenting more detail on the physical construction of the detector. The pixels consist of a common substrate layer 3005, p- and n-layers (2001 and 2002, which have been shown in FIGS. 2 and 3), and a passivation layer 3007 on top of 2002, as well as side passivation 3006. Special metal 3003 interconnects the top layer 2002 of the pixels through a gap in the passivation 3006 as shown.

FIG. 3 also shows an interconnected array 3010 with pixels 1002 that are interconnected with pixel-to-pixel connections 3013. In this arrangement, the pixels 1002 are not fully separated during etching or other process steps used for pixel delineation. Instead, a small "bridge" of material is left, which forms the interconnect 3013.

Either of the methods depicted in FIG. 3 could be used for grouped interconnects, as in FIG. 1, array 1010, or for fully interconnected arrays as in FIG. 1, array 1001. These methods are not preferred, but they are a practical way to implement an array according to the present invention. They are advantageous because they can be used with existing readout designs. They require mask changes on the detector only.

Figure 4:
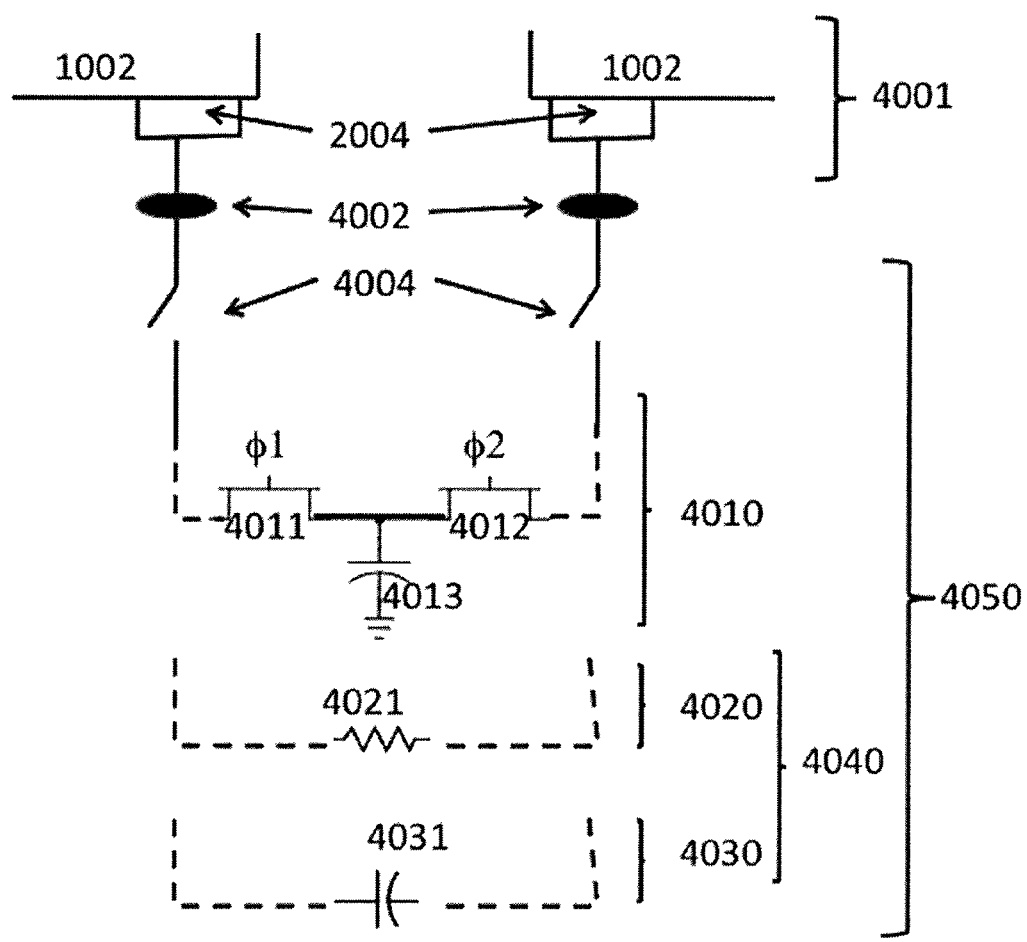
FIG. 4—depicts pixel-to-pixel interconnect, circuit methods.

FIG. 4 depicts multiple preferred methods for implementing pixel-to-pixel interconnects using read out circuit elements dedicated to that purpose. These methods have multiple advantages, including turning the pixel-to-pixel interconnect on and off, providing variable impedance, capacitance (the ability to store an electrical charge) or resistance, and allowing for more precise manufacturing process control of the impedance circuit.

In FIG. 4, two pixels 1002 are interconnected. The pixels consist of detector elements 4001 and readout elements 4050. Each detector pixel element 4002 connects to its interconnect circuit through contact 2004, indium bump 4003, and switch 4004. The interconnect circuits can be turned on or off with the switch 4004. Three different methods are shown as potential interconnect implementations. The first, 4010, utilizes a switched capacitor variable resistance circuit. This may be implemented as shown or with similar circuits. Two out-of-phase clocks $\phi1$ and $\phi2$ control transistor switches 4011 and 4012. These create a variable resistance by transferring charge off of and onto capacitor 4013 (a passive two-terminal electrical component that stores energy in an electrical field). The effective resistance is a function of the clock frequency of clocks $\phi1$ and $\phi2$.

The second method for readout pixel-to-pixel interconnect is resistive coupling 4020. In this method, a resistor 4021 (a passive two terminal electrical component that implements resistance in an electrical circuit) is implemented on the readout. This element is switched in or out of the circuit, as desired.

The third method is capacitive coupling 4030. In this method, a capacitive element 4031 is switched in or out of the circuit.

A combination of 4020 and 4030 yields 4040, a combined resistive-capacitive interconnect.

Pixels according to the present invention can be arranged in any desired manner. Signal contacts to the photodiode amplifier may be placed in the center, corners or edges. For example, different arrangements could be used for fully interconnected arrays versus arrays with interconnected groups of pixels. Interconnect contacts can be located on corners or edges. Contacts can be of any size or shape, as required to optimize design and performance of a specific implementation.

Figure 5:
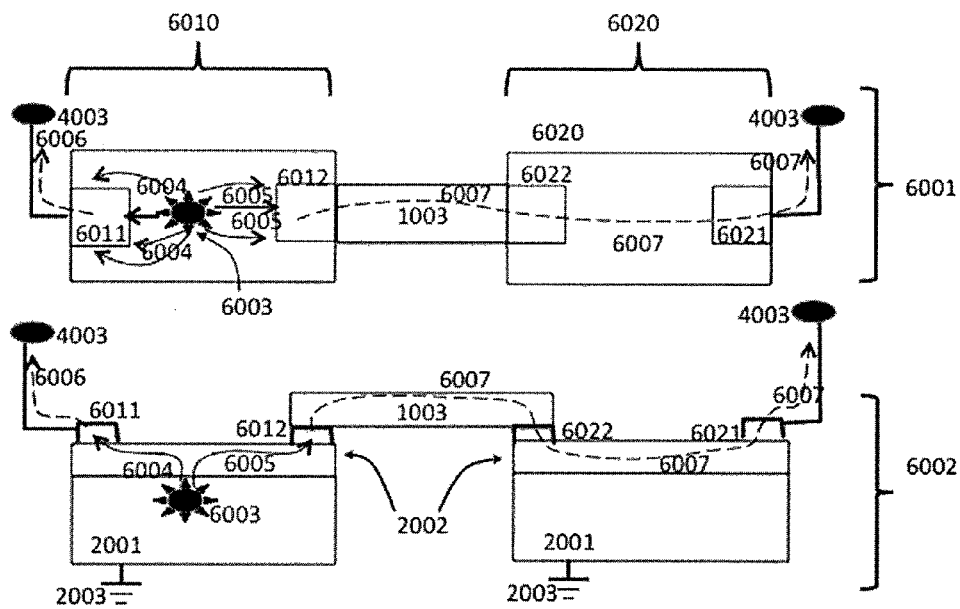
FIG. 5—depicts crosstalk and sheet resistance (pixel lateral resistance) effects that enable subpixel sensing.

FIG. 5 illustrates how the crosstalk effect works to enable subpixel positional sensing. An array according to the present invention that is grouped in pairs is used as an example. FIG. 5 is a top plan view 6001 of a pair of pixels in this array, showing x- and y-dimensions. Side view 6002 shows the vertical, or z-dimension. Interconnect 1003 connects the two pixels—it can be realized as special material 3003, pixel "bridge" 3007, or readout circuits 4010, 4020, 4030 or 4040 (as shown in FIG. 4).

In FIG. 5, both 6001 and 6002 show an illuminated pixel 6010 and its paired pixel 6020. Pixel 6010 includes a signal contact 6011 and an interconnect contact 6012. Pixel 6020 includes a signal contact 6021 and an interconnect contact 6022. Both pixels include layers 2001 and 2002 as well as ground connection 2003 (as shown in 6002). 2001 could be p- or n-material and 2002 is the opposite.

Pixel 6010 is illuminated with a focused subpixel spot of light 6003. This generates electrons and electrical current flows 6004 and 6005 to the contacts 6011 and 6012. These are three-dimensional current flows, as indicated in the 6001 and 6002 views. Electrons are generated in the lower layer 2001, near the p-n or n-p junction of pixel 6010. From there, the electric field (E-field) created by the diode bias pulls electrons into the top layer 2002, which is primarily a vertical, or z-dimension current flow, and then laterally to the contacts. The top view 6001 shows the detail of the lateral current flow, which spreads horizontally en route to contacts 6011 and 6012.

In FIG. 5, the lateral resistance for currents 6004 and 6005 is characterized by the variable sheet resistance (pixel lateral resistance) of pixel 6010 plus the fixed sheet resistance of pixel 6020. Sheet resistance is a measure of resistance of thin films that are nominally uniform in thickness. All photodiodes will exhibit this sheet resistance phenomenon. Sheet resistance is measured in ohms per square ($\Omega$/sq) (which is dimensionally equal to an ohm, but is exclusively used for sheet resistance) so that the length to width ratio of the conducting area determines the total resistance.

Figure 6:
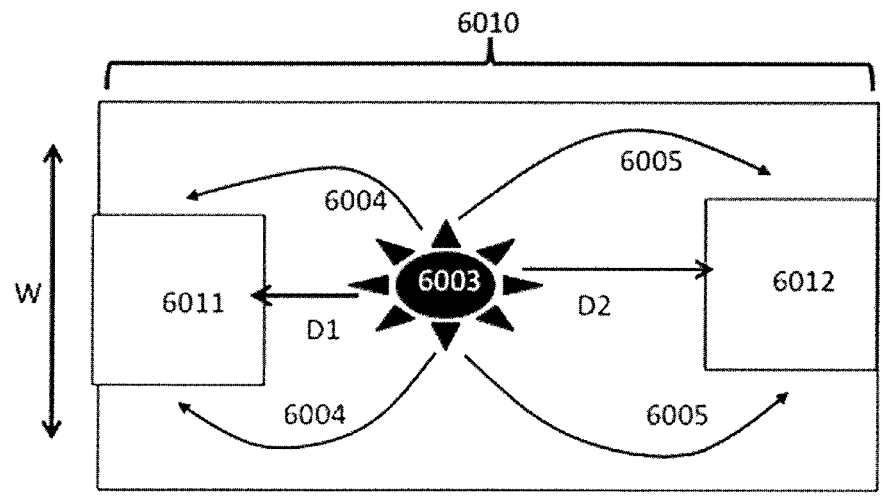
FIG. 6—depicts a side view of crosstalk and sheet resistance effects.

FIG. 6 shows how this works for pixel 6010. Width W is determined by the width of current flows 6004 and 6005, which are relatively constant for any spot 6003 position. However, distances D1 and D2 vary significantly for different spot positions. Therefore, a shift in position will result in an impedance difference and different signal ratios at the readouts for pixels 6010 and 6020. This difference in signal ratios is used to determine the subpixel position of focused spot 6003.

In the array according to the present invention, total pixel-to-pixel impedance is optimized to balance satisfactory noise performance with satisfactory subpixel positional location performance. Minimizing noise requires as high a pixel-to-pixel impedance as possible when crosstalk interconnect is enabled. Pixel sheet resistance alone cannot be made high enough to avoid noise issues. Therefore, to enhance pixel sheet resistance, the present invention utilizes an interconnect impedance with a value somewhat higher than the total pixel sheet resistance.

In the presently preferred embodiment of the invention, the sheet resistance of the pixels is first optimized. This allows a designed interconnect impedance that complements this optimized sheet resistance to be used in the final design. This ensures that the total resistance seen by the readout amplifier 2006 (shown in FIG. 2) will be adequately high to avoid noise amplification issues caused by low impedance. There are multiple methods by which the present invention pixel sheet resistance is optimized:

Using the smallest possible contacts 2004 and 2005 (shown in FIG. 4)
Thinning layer 2002, the top layer
Pattern etching the top layer 2002
Changing the standard doping of the top layer 2002
Implanting impurities into the top layer 2002
Performing an extended anneal step to allow impurities to migrate into the top layer 2002 from the passivation layer 3007, effectively thinning 2002

Figure 7:
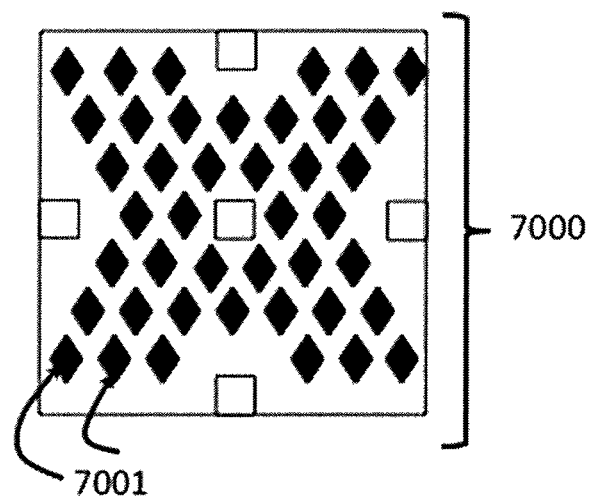
FIG. 7—depicts two specific methods for enhancing diode sheet resistance.
Figure 7:
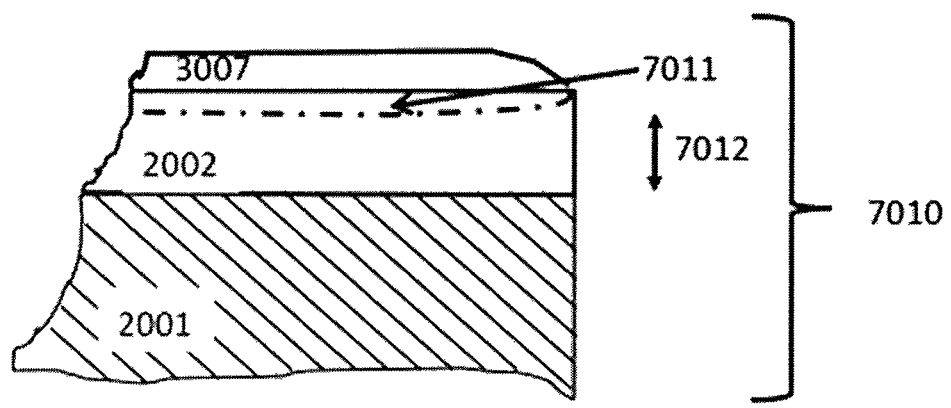

FIG. 7, depicts two of these methods. 7000 shows a top plan view of a pixel with material removed, shown as areas 7001. 7010 shows a side elevation view of a pixel in which passivation material from layer 3007 has migrated into top diode layer 2002 (p- or n-material) to effectively thin the layer. 7011 shows a notional migration line; 7012 shows a notional resulting effective thickness, which is thinner than the physical thickness.

In the preferred embodiment of the present invention, the invention will combine several of these optimization methods to ensure a relatively high sheet resistance. However, sheet resistance cannot be too high, or performance will degrade for very fast signals.

Once the sheet resistance is optimized, an interconnect impedance that complements the sheet resistance is determined. The correct value for the interconnect impedance is a design factor that must account for required signal to noise performance as well as required positional resolution. This value cannot be too high. For example, if the interconnect impedance were to be 100× greater than the total pixel sheet resistance, less than a 1% change in signal values for pixels 6010 and 6020 would result when spot 6003 moved from the extreme left side of 6010 to the extreme right. This is too small a change for practical use. Values of 2× to 10× would be practical, and values of 3× to 6× would be preferred. In determining the correct value, the low frequency impedance of the interconnect is compared to the total sheet resistance. In FIGS. 5 and 6, the total sheet resistance is the side-to-side sheet resistance of pixel 6010 or 6020. For two-dimensional interconnects, as in FIG. 9, the total sheet resistance is the resistance from signal contact 9001 in pixel 9000, to the interconnect contacts 9002, 9003, 9005 and 9005 with all the interconnect contacts grounded.

Figure 8:
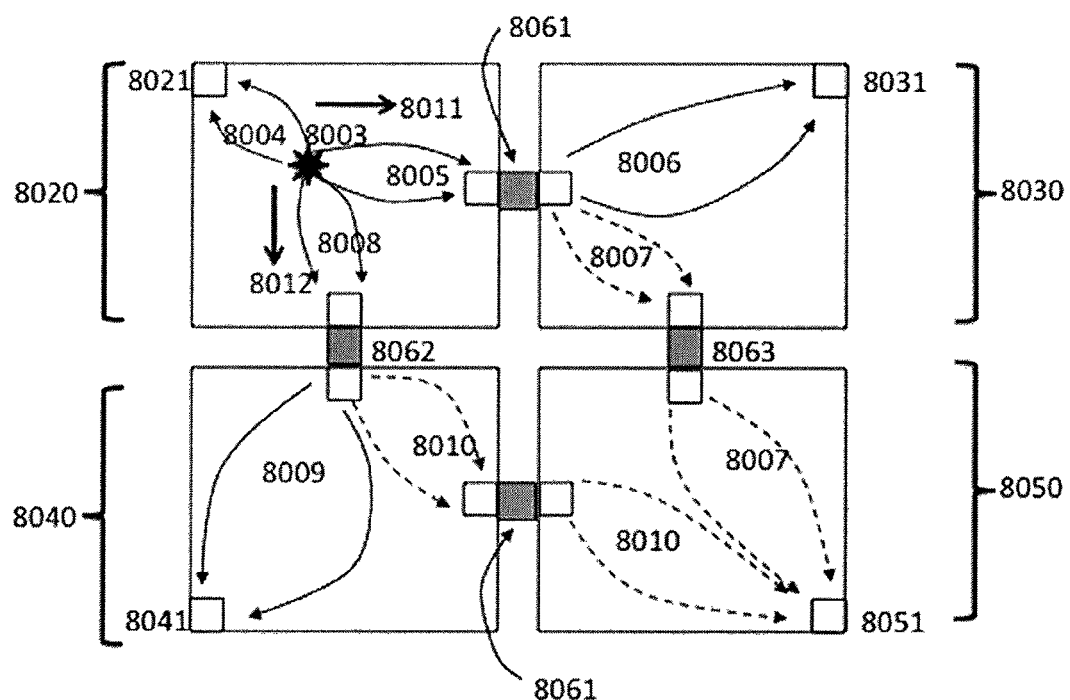
FIG. 8—depicts two-dimensional exact subpixel positional location method.

The present invention uses two methods for determining subpixel position: zonal and exact. Either or both of these methods can be used. FIGS. 5 and 6 can be used to explain the exact method in the case of one-dimensional subpixel positional location. FIG. 8 can be used to explain the exact method for two-dimensional subpixel positional location, and FIG. 9 can be used to explain the zonal method for two-dimensional subpixel positional location. In both cases, zonal and exact, crosstalk signals are isolated and processed to determine the location.

Crosstalk signal processing is explained first. In any of the preferred embodiments of the present invention, the first four steps are identical:

Step 1: Average background brightness is determined for the signal and/or region of interest. "Background" means the scene with no signal of interest. Two approaches are possible, and either one by itself, or the two combined may be used. The first method continuously averages pixel signals. When an event occurs, this average is immediately available. Alternatively, adjacent pixels are averaged when an event is detected on some set of pixels within the array. These methods may be combined to achieve greater accuracy or to deal with short and long events flexibly.

Step 2: Events are detected using well-known statistical methods that utilize spatial and temporal data. This step may use data from step 1, and it is performed continuously. An event is detected when the signal level exceeds a threshold probability limit, which indicates that it is a real signal and not a random variation. Events are detected on a specific pixel or within a contiguous set of pixels.

Step 3: Raw signals are adjusted. Once an event is detected, the raw pixel signals, i.e. containing background plus signal of interest, are adjusted by subtracting the background brightness determined in step 1. This isolates the signal of interest. The pixel with the largest signal is designated as the primary pixel. Non-uniformity correction (NUC) can also be applied at this point, if not already performed in steps 1 or 2. NUC is a well-known technique used to calibrate infrared devices by reducing the inherent pixel-to-pixel variation in electrical amplification and offset that is present in all focal plane arrays (offset is the signal that remains even if there is zero input).

Step 4: A normalized signal ratio calculated. This is performed using the adjusted signal data from step 3. In the two-dimensional case, two normalized signal ratios are calculated: one for the primary pixel and vertically adjacent pixels and one for the primary pixel and horizontally adjacent pixels. Signal metrics can be calculated either by using normalized arithmetic differences or by using direct pixel-to-pixel intensity ratios. An example of a normalized arithmetic difference, appropriate for arrays connected in groups of four, is (Primary_pixel−Left_pixel)/(Primary_pixel+Left_pixel). An example of a direct pixel-to-pixel intensity ratio, also appropriate for arrays connected in groups of four is Left_pixel/Primary_pixel. Normalized arithmetic metrics are the preferred method.

These four steps are performed for both zonal and exact positional determination. They combine the primary pixel signal and the crosstalk signals and provide normalized signal ratios that are used in either the exact or zonal methods.

Referring to FIG. 5 for the one-dimensional exact calculation method, the current flows 6004 and 6005 are determined by the total resistance from spot 6003 to contact 6011, through contact 6011 and readout connect 4003 (indium bump). This set of resistances to the left of spot 6003 is referred to as path 6006. 6006 is compared to the total resistance from spot 6003 to contact 6012, through contact 6012, through interconnect 1003, through contact 6022, from contact 6022 to contact 6021—which is the full end-to-end sheet resistance of pixel 2060—through contact 6021, and through readout connect 4003. This second set of resistances to the right of spot 6003 is referred to as path 6007. The 6006 resistance is highly variable, ranging from a very low value for a focused spot near or on contact 6011, to a much higher value for a focused spot near contact 6012. The 6007 resistance is less variable, since the interconnect 1003 resistance is larger than the pixel 6010 full-length lateral resistance, and this larger resistance is added to the full length resistance of 6020. The combination of these effects results in a contact 6011 signal (pixel 6010) that will vary by a designed amount, such as 10% to 20%, whereas the contact 6021 signal (pixel 6020) will change by a very small amount. Therefore, the ratio of the contact 6011 signal to the contact 6021 signal will vary by a designed amount, allowing a subpixel position to be inferred.

In this embodiment, normalized signal ratios are calculated from signals 6011 and 6021 using the four-step crosstalk processing methods described above. The normalized signal ratios are then used to determine an exact position with the help of position calculation equations, or a look up table. Conceptually, these two methods are identical. The look up table represents the function in tabular form whereas the equation represents it in mathematical form. Either method can be used.

In order to create the look up table or equation, a sensor calibration is performed. This is done one-time only, before the sensor is ever used outside the calibration lab. This step is performed by injecting collimated (aligned) light spots at known spacing, such as every 15 μm across the focal plane, or every 10 milliradians across the field of view. The resulting data relate specific positions to specific signals. From this data, the inverse function is calculated, represented either by an equation or a table relating normalized signal ratios to positions.

In the case of the look up table, exact positions are calculated by interpolating between entries in the table. In the case of equations, exact positions are calculated directly.

FIG. 8 explains the exact method of subpixel positional determination in two-dimensions, using the example of an array according to the present invention with pixels connected in groups of four. A focused spot 8003 illuminates pixel 8020, resulting in current flows 8004, 8005 and 8008. Current 8004 flows directly to signal contact 8021 with the least resistance. Current 8005 flows through the contact/interconnect structure 8061, and then primarily to signal contact 8031 as indicated by current 8006, but with a small current 8007 flowing through contact/interconnect structure 8063 and to signal contact 8051. Current 8008 flows primarily to signal contact 8041 (current 8009) in the same way, with a small current 8010 flowing through 8064 to signal contact 8051.

As spot 8003 moves in the X-direction 8011, the distance to the contact/interconnect structure 8061 is less, reducing the lateral resistance for current 8005, and so it increases. Similarly, as spot 8003 moves in the Y-direction 8012, current 8008 increases. The diode of the present invention is constructed with designed lateral resistance and interconnection impedance so that the signal varies by a designed amount, just as in the one-dimensional case shown in FIGS. 5 and 6. In this case, a two-dimensional function or look up table relates the position of the subpixel focused spot 8003 to the observed signals at 8021, 8031 and 8041. In preferred embodiments with satisfactory high resistance, 8051 receives very low-level signals and can be ignored.

The normalized signal ratios are used to determine exact positions with the help of look up tables or equations. In the two-dimensional case, look up tables are the preferred method. The look up table (or equation) for the two-dimensional case is created using the same steps as for the one-dimensional case; this includes a one-time sensor calibration and calculating an inverse look up table (or equation) from the resulting data.

For the preferred look up table method, an exact position is calculated by performing a two-dimensional interpolation using the closest matching values within the two-dimensional look up table, which correctly bound the observed values. If two-dimensional equations are used, a position is calculated directly.

Figure 9:
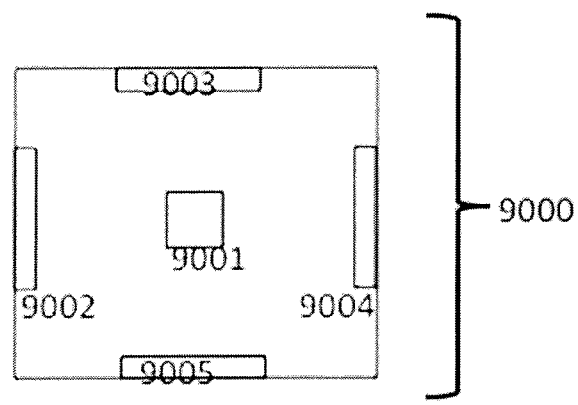
FIG. 9—depicts zonal methods for determining subpixel positional location.
Figure 9:
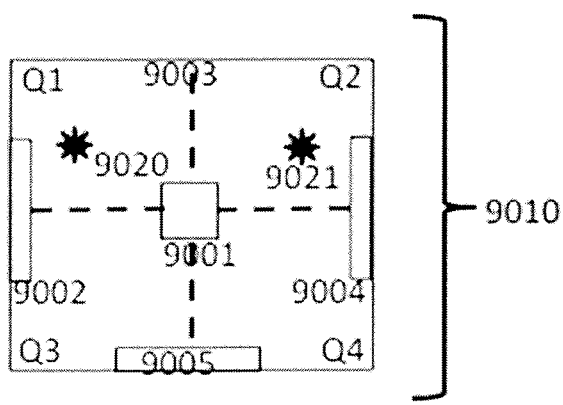

FIG. 9 illustrates the zonal method of subpixel positional location, using a diode with a center signal contact in a fully connected array as an example case. The photodiode pixel 9000 contains a center signal contact 9001, which connects to the amplifier 2006 (not shown) for that diode. It also contains four interconnection contacts 9002, 9003, 9004, and 9005, which connect to neighbor pixels that are not shown.

As shown in FIG. 9, the pixel can be analyzed in quadrants, which are indicated as Q1, Q2, Q3, and Q4 in view 9010. The quadrants can be considered to be virtual subpixels. For focused spot 9020 in Q1, more crosstalk signal will be coupled through interconnect contacts 9002 and 9003 than the other interconnects, and this indicates that the signal lies in Q1. Similarly, for spot 9021 in Q2, the highest crosstalk signal would be coupled through contacts 9003 and 9004. In this manner, it is possible to use simple magnitude comparisons to determine subpixel location within a quadrant.

Normalized signal ratios calculated using the four-step crosstalk signal processing method are used for the magnitude comparisons. This basic concept can be extended such that more than four virtual subpixels are defined. This requires more precise signal comparisons and nothing else. The zonal method is an approximation method and does not achieve the accuracy of the exact calculation method. For example, rather than achieving an accuracy of $\frac{1}{25}^{th}$ pixel size, the four quadrant method achieves an accuracy on the order of $\frac{1}{8}^{th}$ pixel size.

These methods allow the arrays of the present invention to be built in many configurations, preferred and alternative. Preferred implementations allow for high-speed operation—4000 frames per second or higher—and very accurate subpixel sensing—$\frac{1}{25}^{th}$ the pixel size or better. Pixels may be large or small, but preferred implementations utilize pixels that are larger than normal. Practical pixels sizes are smaller to 4× larger in linear dimension than the diffraction blur of the optical system to be used with the sensor; preferred pixel sizes are 1.5× to 3× larger in linear dimension than the diffraction blur of the optical system to be used with the sensor; and optimal pixel sizes are 1.5× to 2× larger in linear dimension than the diffraction blur of the optical system to be used with the sensor. Ultimately, the larger pixel sizes result in fewer total pixels, which allows for high-speed clocking without excessive output data rates. In the preferred configuration, pixel lateral resistance (sheet resistance) is enhanced so that it is larger than inherent lateral resistance. Practical lateral resistance values are 1.5× to 2.5× larger than inherent lateral resistance; preferred lateral resistance values are 2.5× to 5× larger than inherent lateral resistance; and optimal lateral resistance values are 4× to 5× larger than inherent lateral resistance. In preferred implementations, cross-connect circuits are implemented as part of the readout circuit.

Alternative implementations also provide advantages, but they may not realize the full set of advantages that is possible in a preferred implementation. For example, an array with a larger number of elements can still provide extremely accurate subpixel sensing, but it would likely be operated at a slower frame rate. Smaller pixels will still provide extremely accurate positional sensing, but would most likely be operated at slower rates. Nevertheless, alternative implementations may be more appropriate under certain circumstances.

While the present invention is being disclosed in connection with the presently preferred embodiment described herein, it should be understood that there might be other embodiments that fall within this spirit and scope of the invention as defined by the claims. Accordingly, no limitations are to be implied or inferred in this invention except as specifically and as explicitly set forth in the claims.

INDUSTRIAL APPLICABILITY

This invention can be used any time it is necessary to increase resolution without increasing pixel count, such as when necessary to achieve high-precision, high-speed detection (sensing) capabilities.

What is claimed is:

1. A process for subpixel resolution of a light spot on a focal plane array comprising:
   interconnecting a plurality of pixels with interconnections having signal changing properties;
   illuminating one of said pixels with said light spot to generate crosstalk current flows to neighboring pixels;
   measuring at least one of said crosstalk current flows to said neighboring pixels;
   determining signal metrics among said crosstalk current flows; and
   calculating subpixel resolution of said light spot by associating said signal metrics with a subpixel location on said focal plane array using a method selected from the group consisting of a look up table and an equation.

2. A process according to claim 1, wherein said interconnecting step is performed using a pixel-to-pixel connection having read out circuit elements.

3. A process according to claim 1, wherein said signal changing properties are selected from the group consisting of capacitance, resistance, impedance, or a combination thereof.

4. A process for subpixel resolution of a light spot on a pixel in an array of pixels, with a first pixel having a first sheet resistance operably connected to a first readout device, interconnected with an interconnection having an interconnect resistance and signal changing properties to a second pixel having a second sheet resistance operably connected to a second readout device, wherein said first sheet resistance and said second sheet resistance have been optimized to provide a total resistance seen by a readout amplifier connected to said first and second readout devices to avoid noise amplification issues created by low impedance comprising:
   determining average background brightness of said array of pixels;
   illuminating said first pixel with said light spot to generate a primary signal current flow to said first readout device and a crosstalk signal current flow to said second readout device through said interconnection to said second pixel;
   subtracting said average background brightness from said primary signal current flow and said crosstalk signal current flow;
   determining signal metrics for said primary signal current flow measured at said first readout device and said crosstalk signal current flow measured at said second readout device; and
   calculating said subpixel resolution of said light spot by relating said signal metrics to a subpixel position on said array of pixels using a method selected from the group consisting of a look up table and position calculation equations.

5. A process for subpixel resolution of a light spot on a plurality of interconnected pixels, each of said pixels having a signal contact defining virtual quadrants and interconnections spanning between neighboring pixels, wherein each of said interconnections has signal changing properties comprising:
   illuminating one of said virtual quadrants with said light spot to generate crosstalk current flows to neighboring pixels through said interconnections;
   measuring said crosstalk current flows at said interconnections;
   determining subpixel resolution of said light spot within said virtual quadrants from said crosstalk current flows.

6. A process according to claim 5, wherein said signal changing properties are selected from the group consisting of capacitance, resistance, impedance, or a combination thereof.

7. A pixel array having a plurality of interconnected pixels comprising:
   a first pixel, having a first semiconductor layer with a second semiconductor layer laid on top of said first semiconductor layer, wherein said first pixel has a first sheet resistance and a first signal contact operably connected to a first read out device;
   a second pixel, having a third semiconductor layer with a fourth semiconductor layer laid on top of said third semiconductor layer, wherein said second pixel has a second sheet resistance and a second signal contact operably connected to a second read out device;
   wherein said first pixel and said second pixel are connected by an interconnection having signal changing properties;
   whereby illumination of said first pixel generates a primary signal current that travels to said first signal contact and is read by said first readout device and a crosstalk signal current that travels through said interconnection and said second signal contact to said second readout device; and
   whereby signal metrics of said primary signal current read by said first readout device and said crosstalk signal current read by said second readout device allows for subpixel sensing.

8. A pixel array according to claim 7, wherein said second semiconductor layer and said fourth semiconductor layer are effectively thinned to optimize said first sheet resistance and said second sheet resistance.

9. A pixel array according to claim 7, wherein said interconnection is a pixel-to-pixel connection having read out circuit elements.

10. A pixel array according to claim 7, wherein said signal changing properties are selected from the group consisting of capacitance, resistance, impedance, or a combination thereof.

* * * * *